(12) United States Patent
Kobayashi et al.

(10) Patent No.: US 8,722,512 B2
(45) Date of Patent: May 13, 2014

(54) METHOD OF MANUFACTURING SEMICONDUCTOR DEVICE WITH A DUMMY LAYER

(75) Inventors: Nobuji Kobayashi, Kakamigahara (JP); Tetsuya Yamada, Gifu (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 12/636,405

(22) Filed: Dec. 11, 2009

(65) Prior Publication Data

US 2010/0159670 A1 Jun. 24, 2010

(30) Foreign Application Priority Data

Dec. 18, 2008 (JP) .................................. 2008-322835

(51) Int. Cl.
*H01L 21/76* (2006.01)

(52) U.S. Cl.
USPC .... 438/439; 438/197; 438/585; 257/E21.409; 257/E21.552

(58) Field of Classification Search
USPC .......... 438/439, 585, 197, E21.409, E21.552; 257/E21.409, E21.552
See application file for complete search history.

(56) References Cited

U.S. PATENT DOCUMENTS

| | | | |
|---|---|---|---|
| 7,611,952 B2 | 11/2009 | Suzuki | |
| 2004/0077163 A1* | 4/2004 | Chang et al. | 438/689 |
| 2005/0156220 A1* | 7/2005 | Segawa et al. | 257/304 |
| 2006/0157752 A1* | 7/2006 | Suzuki | 257/288 |
| 2006/0228850 A1* | 10/2006 | Tsai et al. | 438/219 |
| 2010/0159670 A1* | 6/2010 | Kobayashi et al. | 438/439 |

FOREIGN PATENT DOCUMENTS

| | | |
|---|---|---|
| JP | 59-182541 | 10/1984 |
| JP | 1-189924 | 7/1989 |
| JP | 6-232090 | 8/1994 |
| JP | 8-250481 | 9/1996 |
| JP | 11-67932 | 3/1999 |
| JP | 2006-196735 | 7/2006 |

* cited by examiner

*Primary Examiner* — Elias M Ullah
(74) *Attorney, Agent, or Firm* — Morrison & Foerster LLP

(57) ABSTRACT

The invention enhances the accuracy of an end point detection when an insulation film formed on a semiconductor substrate is dry-etched. Gate layers made of polysilicon are formed, and an end point detection dummy layer made of polysilicon is formed on a LOCOS. After the gate layers and the dummy layer are formed, a TEOS film is formed on a silicon substrate so as to cover the gate layers and the dummy layer. The TEOS film, a thin gate oxide film and a thick gate oxide film are then dry-etched to form sidewalls on the sidewalls of the gate layers and also expose the front surface of the P well of the silicon substrate in a region surrounded by the LOCOS. The end point detection dummy layer helps the end point detection by being exposed during this dry-etching to enhance the accuracy of the end point detection.

6 Claims, 4 Drawing Sheets

FIG.4A  ratio of polysilicon area 19.8%
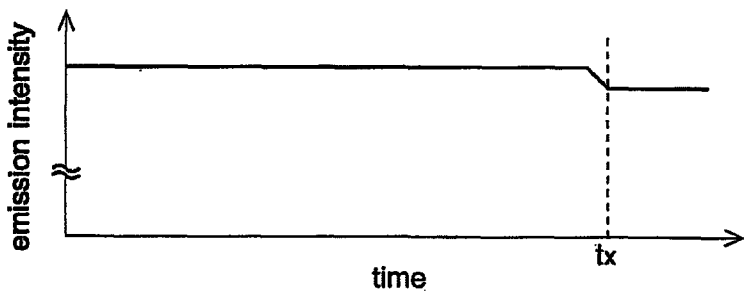
FIG.4B  ratio of polysilicon area 26.3%
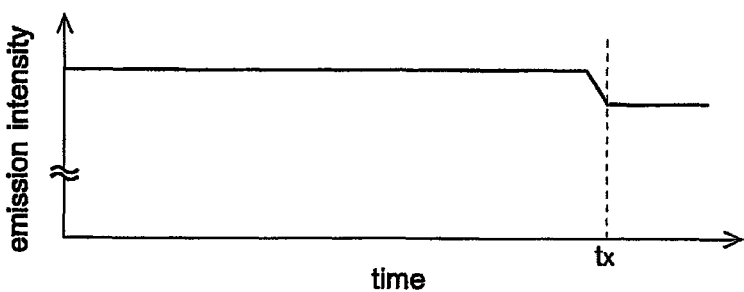
FIG.4C  ratio of polysilicon area 39.3%
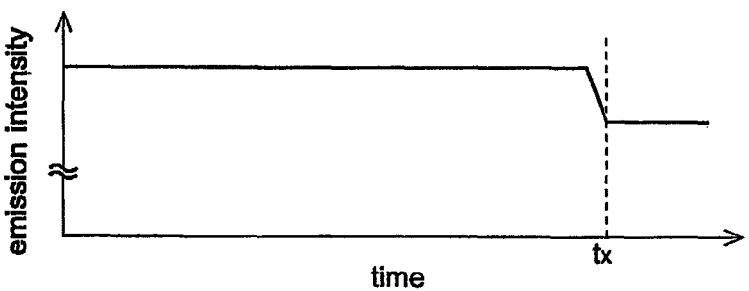
FIG.4D  ratio of polysilicon area 50.1%
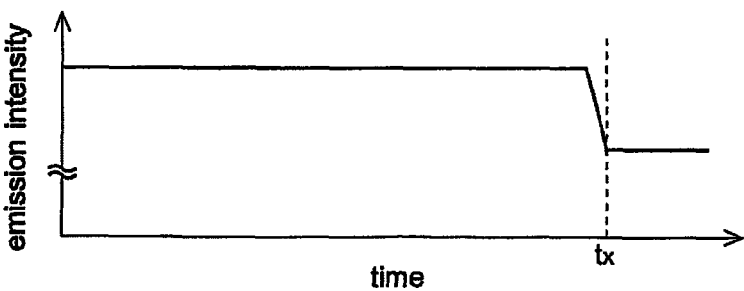

METHOD OF MANUFACTURING SEMICONDUCTOR DEVICE WITH A DUMMY LAYER

CROSS-REFERENCE OF THE INVENTION

This application claims priority from Japanese Patent Application No. 2008-322835, the content of which is incorporated herein by reference in its entirety.

BACKGROUND OF THE INVENTION

1. Field of the Invention

The invention relates to a method of manufacturing a semiconductor device and an end point detection of dry-etching of an insulation film.

2. Description of the Related Art

Conventionally, a semiconductor process includes a process of dry-etching an insulation film formed on a semiconductor substrate to expose the semiconductor substrate. In this case, there is a problem such that the semiconductor substrate is damaged by being over-etched and the transistor characteristics are degraded. In order to prevent this problem, it is important to minimize the over-etching amount by detecting an etching end point accurately.

As a known method of detecting an end point of dry-etching, there is a method of detecting an end point based on a change of emission intensity (an emission amount) of a specific spectral line of plasma that is observed during dry-etching. In detail, in the case described above, as the etching of the insulation film to be etched is started, constant emission intensity is obtained by the etching of the insulation film. When the semiconductor substrate under the insulation film is then exposed and etched, the emission intensity changes. Therefore, the end point of the etching is detectable based on the difference of the levels of the emission intensity.

In the method of detecting the end point described above, however, when the area of the semiconductor substrate (an active region) to be exposed under the insulation film is small, the emission intensity of the specific spectral line of plasma is too small to distinguish the levels of the emission intensity.

In particular, when insulation films having different thicknesses are dry-etched simultaneously, the etching needs to be stopped by end point detection at the time when the semiconductor substrate under the thicker insulation film is exposed. In detail, after the etching is started, the thinner insulation film is removed by the etching to expose the semiconductor substrate under the thinner insulation film first. At this time, the thicker insulation film still remains. The thicker insulation film is then removed by the etching to expose the semiconductor substrate under the thicker insulation film.

Since the semiconductor substrate under the thinner insulation film is etched for a longer time, it is important to minimize the over-etching amount. However, it is difficult to perform such end point detection accurately by the method of detecting the end point described above.

SUMMARY OF THE INVENTION

The invention provides a method of manufacturing a semiconductor device. The method includes forming an element isolation film on a semiconductor substrate so as to surround a region of the semiconductor substrate, forming a gate insulation film on a front surface of the semiconductor substrate and in the region surrounded by the element isolation film, forming a gate layer on the gate insulation film, forming an insulation layer so as to cover the gate layer and the semiconductor substrate, and dry-etching the insulation layer and the gate insulation film so as to form a sidewall covering a side surface of the gate layer and to expose the front surface of the semiconductor substrate in the region surrounded by the element isolation film. A dummy layer for detecting an end point of the dry-etching is formed on the element isolation film before the formation of the insulation layer.

BRIEF DESCRIPTION OF THE DRAWINGS

FIGS. 4A, 4B, 4C and 4D are graphs for explaining a detection of an end point of dry-etching.

DETAILED DESCRIPTION OF THE INVENTION

An embodiment of the invention will be described referring to the figures. Although the invention is applicable to a case where one type of insulation film is dry-etched and enhances the accuracy of the end point detection, a case where two types of insulation films having different thicknesses are dry-etched simultaneously will be described here as a preferable application example of the invention.

First, a method of forming two types of gate insulation films having different thicknesses on a silicon substrate will be described referring to FIGS. 1A, 1B and 1C. In this case, the thinner gate insulation film is used for a low breakdown voltage MOS transistor, and the thicker gate insulation film is used for a high breakdown voltage MOS transistor.

Figure 1A:
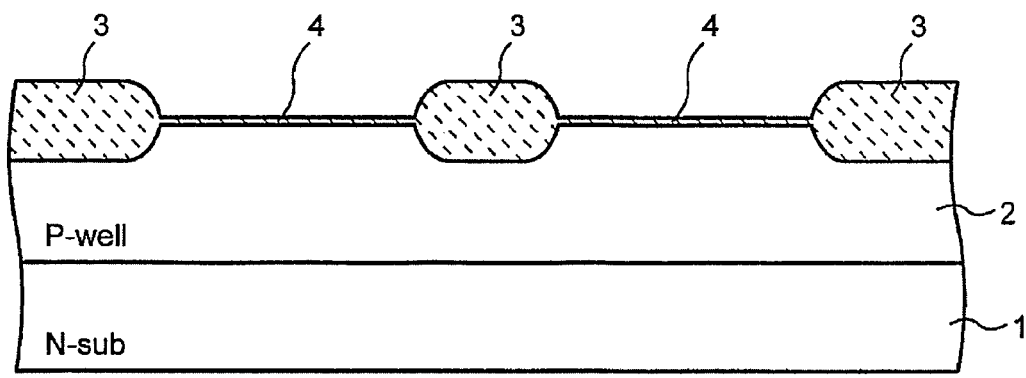
FIGS. 1A, 1B and 1C are cross-sectional views for explaining a method of manufacturing a semiconductor device of an embodiment of the invention.

As shown in FIG. 1A, a P well 2 is formed on a front surface of an N type silicon substrate 1 by ion implantation and thermal diffusion. A LOCOS 3 having a thickness of, for example, about 500 nm is then formed by a local oxidation method. The LOCOS 3 is an example of an element isolation film, and other element isolation structure such as a shallow trench insulation film (STI) may be used instead. A portion of the P well 2 surrounded by the LOCOS 3 is to be a region for forming elements (an active region). A silicon oxide film 4 is then formed on the front surface of the P well 2 by thermal oxidation.

Figure 1B:
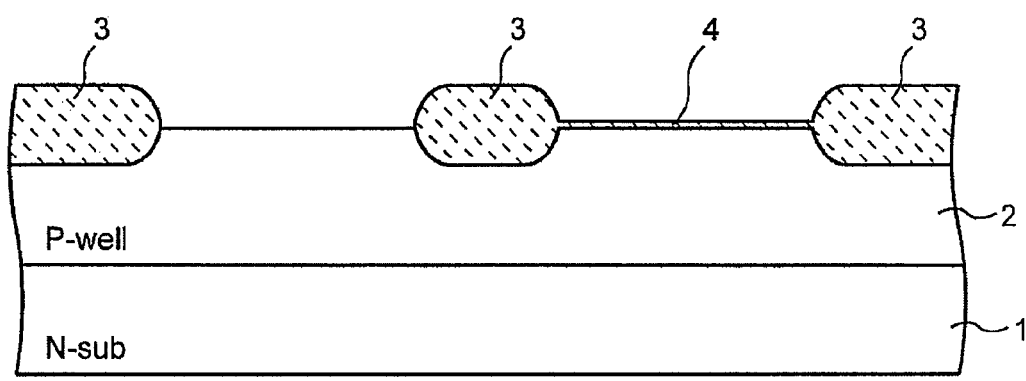

As shown in FIG. 1B, the silicon oxide film 4 in the region for forming the low breakdown voltage MOS transistor is then selectively etched and removed by an etching process using a mask (not shown) formed by, for example, a photolithography process.

Figure 1C:
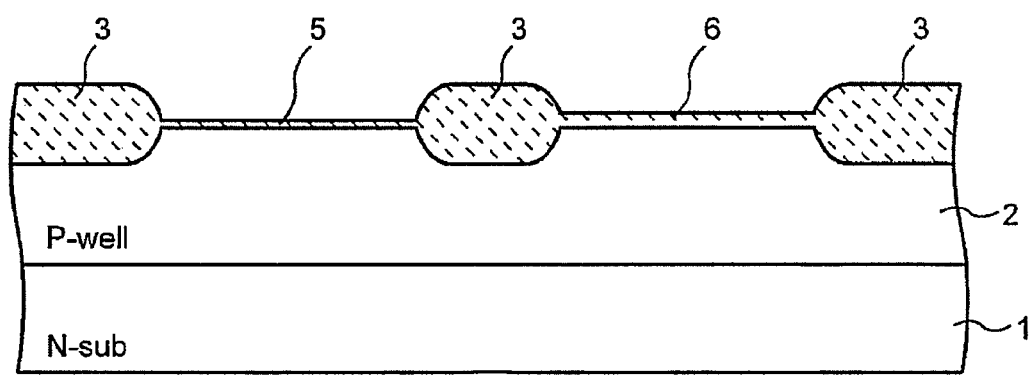

As shown in FIG. 1C, second thermal oxidation is then performed. By this process, a thin gate oxide film 5 (a silicon oxide film) is formed in the region for forming the low breakdown voltage MOS transistor (on the left side in the figure), and a thick gate oxide film 6 (a silicon oxide film) is formed in the region for forming the high breakdown voltage MOS transistor (on the right side in the figure) that is next to the region for forming the low breakdown voltage MOS transistor. The thickness of the thin gate oxide film 5 is 7 nm, for example, and the thickness of the thick gate oxide film 6 is 45 nm, for example.

Figure 2A:
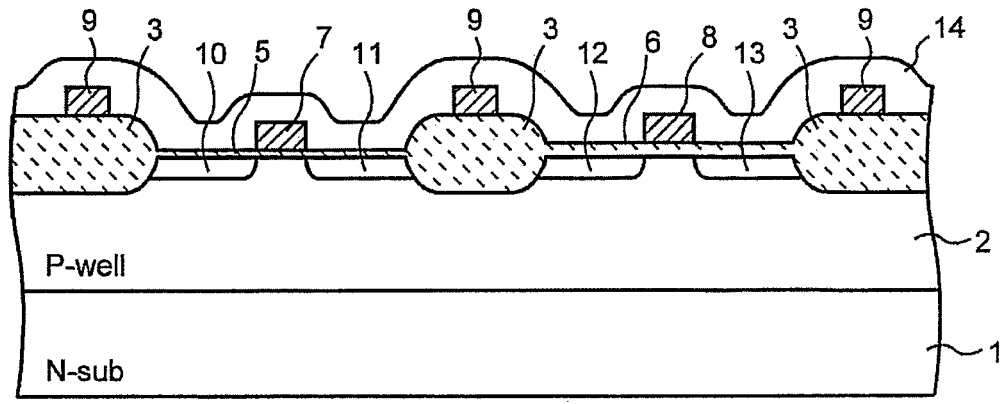
FIGS. 2A, 2B and 2C are cross-sectional views for explaining the method of manufacturing the semiconductor device of the embodiment of the invention.

As shown in FIG. 2A, a polysilicon film is then deposited on the whole surface of the silicon substrate by a CVD method so as to have a thickness of about 400 nm, and this is etched using a mask (not shown) formed by, for example, a photolithography process to form a gate layer 7 on the thin gate oxide film 5 in the region for forming the low breakdown voltage MOS transistor and a gate layer 8 on the thick gate oxide film 6 in the region for forming the high breakdown voltage MOS transistor and simultaneously form an end point detection dummy layer 9 made of polysilicon on the LOCOS 3. This end point detection dummy layer 9 is not electrically connected to the wiring or device of the semiconductor integrated circuit including the gate layers 7, 8, and is isolated in the pattern. Therefore, the dummy layer 9 is easily disposed on the LOCOS 3 without a change of the design layout of the gate layers 7, 8 that are on the same level as the dummy layer 9.

It is noted that the gate layers 7, 8 and the dummy layer 9 may be made of different materials in different processes respectively. However, by forming these using a same material in a same process as described above, the manufacturing process is simplified and the manufacturing cost is reduced.

A low concentration of N− type impurities (e.g. phosphorus) is then ion-implanted using the gate layers 7, 8 as a mask to form an N− type source layer 10 and an N− type drain layer 11 for the low breakdown voltage MOS transistor and form an N− type source layer 12 and an N− type drain layer 13 for the high breakdown voltage MOS transistor. A TEOS film 14 that is a silicon oxide film is then deposited on the whole surface of the silicon substrate by a CVD method so as to have a thickness of about 600 nm.

Figure 2B:
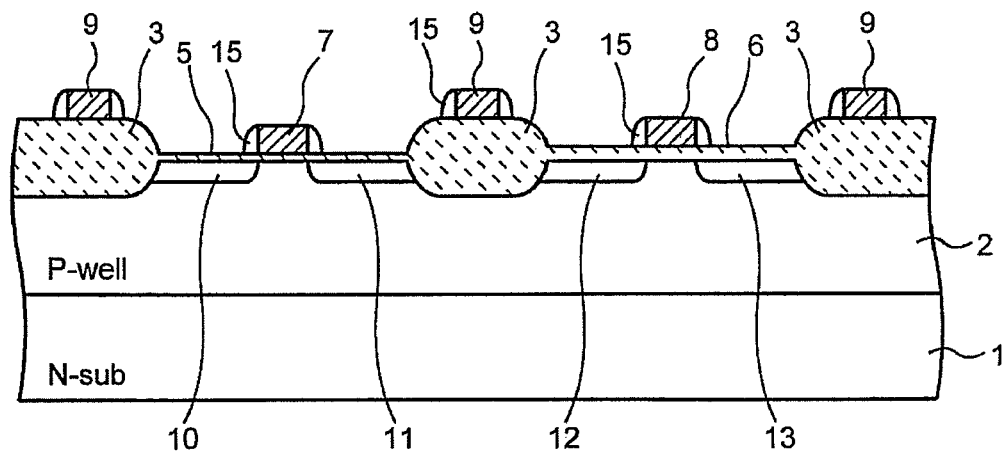
Figure 2C:
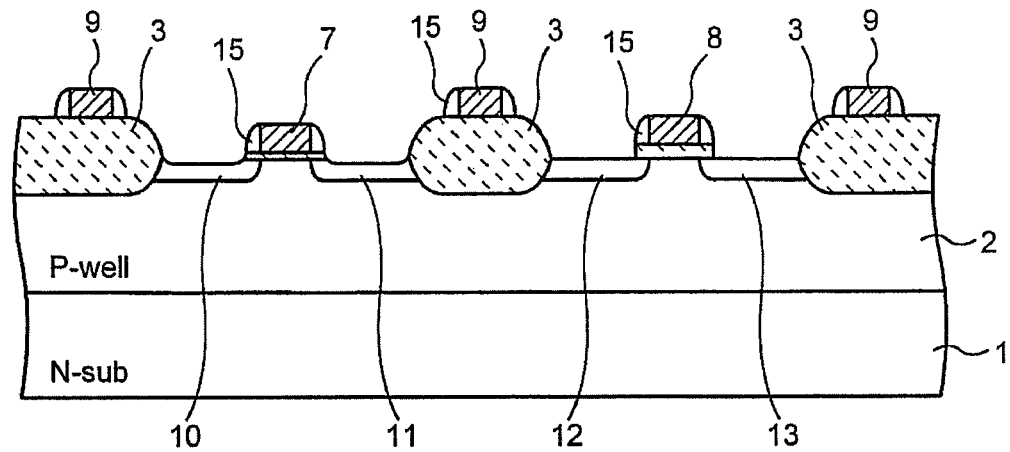

As shown in FIG. 2B, the TEOS film 14 is then dry-etched to form sidewalls 15 made of the TEOS on the sidewalls of the gate layers 7, 8. The sidewalls 15 may be made of a silicon nitride film, and in this case a silicon nitride film is formed instead of the TEOS film 14 and this silicon nitride film is dry-etched. As shown in FIG. 2C, this dry-etching is then further continued to etch the thin gate oxide film 5 and the thick gate oxide film 6 under the TEOS film 14 simultaneously. The reason the thin gate oxide film 5 and the thick gate oxide film 6 are etched is to enhance the controllability of ion implantation for forming N+ type source and drain layers that will be described below. In detail, if the N+ type source and drain layers are formed by ion implantation in the state where the thin gate oxide film 5 and the thick gate oxide film 6 remain, a problem occurs such that the sheet resistance values of the N+ type source and drain layers differ between the low breakdown voltage MOS transistor and the high breakdown voltage MOS transistor due to the difference of the thicknesses. Furthermore, the reason these are simultaneously etched is to rationalize the process. In this case, etching gas for the dry-etching is mixture gas of $CHF_3$ and $CF_4$, for example.

When the thin gate oxide film 5 and the thick gate oxide film 6 are dry-etched simultaneously, the thin gate oxide film 5 is removed first to expose the silicon substrate 1 (the P well 2) in the region for forming the low breakdown voltage MOS transistor, and then the thick gate oxide film 6 is removed to expose the silicon substrate 1 (the P well 2) in the region for forming the high breakdown voltage MOS transistor. Therefore, in order to minimize the over-etching amount of the silicon substrate in the region for forming the low breakdown voltage MOS transistor, it is necessary to detect the end point at the time when the silicon substrate 1 (the P well 2) under the thick gate oxide film 6 is exposed.

In this regard, since the end point detection dummy layer 9 made of polysilicon is formed on the LOCOS 3 in the embodiment, the end point detection dummy layer 9 helps the end point detection described above by being exposed during the dry-etching and enhances the detection accuracy.

In an experiment by the inventors, by forming the end point detection dummy layer 9, the change of the emission intensity of a specific spectral line (in this case, a spectral line of about 482.5 nm wavelength) of plasma at the time when the silicon substrate 1 (the P well 2) under the thick gate oxide film 6 is exposed was increased.

Hereafter, the result of this experiment will be described referring to FIG. 4. In this experiment, samples in which the ratio of the area of the silicon region to the whole area of the front surface of the silicon substrate 1 is varied like A 19.8%, B 26.3%, C 39.3% and D 50.1% by forming the end point detection dummy layer 9 are prepared, and the change of the spectral line with time during the dry-etching described above were measured. It is noted that the silicon region mentioned above includes the polysilicon portions forming the gate layers 7, 8 and the dummy layer 9 and a portion of the silicon substrate 1 (the P well 2) exposed by the dry-etching of the thick gate oxide film 6.

The reduction of the emission intensity at a time tx corresponds to the time when the thick gate oxide film 6 is removed to expose the silicon substrate 1 (the P well 2) in the region for forming the high breakdown voltage MOS transistor.

As apparent from this, as the ratio of the silicon region to the whole area increases, the reduction of the emission intensity at the time tx increases and the level difference in emission intensity between before the time tx and at the time tx increases. This means that the disposition of the dummy layer 9 on the LOCOS 3 is effective to enhance the accuracy of the end point detection during the dry-etching since it certainly increases the ratio of the silicon region to the whole area of the silicon substrate 1.

At this time, if the dummy layer 9 is disposed on the other region than on the LOCOS 3 as a structure different from the embodiment, for example, if the dummy layer 9 is disposed on the thin gate oxide film 5 or the thick gate oxide film 6, the silicon region is not increased since a portion of the silicon substrate 1 (the P well 2) that is exposed during the dry-etching is merely replaced by the polysilicon portion forming the dummy layer 9. Therefore, the effect as achieved by the embodiment is not obtained.

In the method of detecting the end point described above, in order to measure the change of the spectral line with time during the dry-etching as shown in FIG. 4, a box may be provided in advance and the end point detection may be performed by detecting whether the waveform that enters the box from the left side exits the box from the right side or exits the box from the lower side.

As described above, in the embodiment, by disposing the dummy layer 9 on the LOCOS 3, the time (the time tx) when the thick gate oxide film 6 is removed to expose the silicon substrate 1 (the P well 2) in the region for forming the high breakdown voltage MOS transistor is accurately measured.

Figure 3:
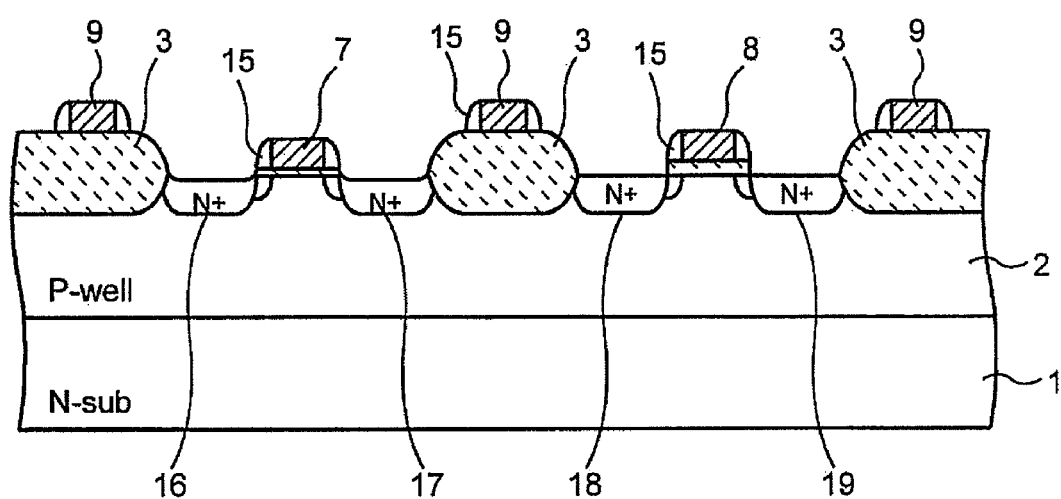
FIG. 3 is a cross-sectional view for explaining the method of manufacturing the semiconductor device of the embodiment of the invention.

After the thin gate oxide film 5 and the thick gate oxide film 6 are etched and removed in this manner, as shown in FIG. 3, a high concentration of N type impurities (e.g. arsenic) is ion-implanted to form an N+ type source layer 16 and an N+ type drain layer 17 for the low breakdown voltage MOS transistor and simultaneously form an N+ type source layer 18 and an N+ type drain layer 19 for the high breakdown voltage MOS transistor.

Although an N channel type MOS transistor is used as an example in the embodiment described above, the invention is also applicable to a case where a P channel type MOS transistor is formed in the similar manner.

Furthermore, although there are two types of oxide films, i.e., the thin gate oxide film 5 and the thick gate oxide film 6 in the embodiment described above, the invention is also applicable to a case where there are three or more types of oxide films in the similar manner.

Furthermore, since the invention is based on a principle such that the end point detection and detection accuracy are enhanced by forming the end point detection dummy layer 9 made of polysilicon on the LOCOS 3 and by exposing this dummy layer 9 during the dry-etching, the invention is also applicable to a case where one type of gate insulation film is dry-etched to expose the silicon substrate 1 (the P well 2) and enhances the accuracy of the end point detection. Furthermore, the invention is also applicable to a case where gate layers formed on one type of gate insulation film have sidewall portions made of other insulation layer, and would enhance the accuracy of the end point detection.

In the invention, an end point detection dummy layer is formed on an element isolation film so as to detect an end point of dry-etching. Therefore, even when the area of a semiconductor substrate that is exposed by dry-etching is small, this is compensated by the end point detection dummy layer to enhance the accuracy of the end point detection.

In particular, the invention is preferably applied to a case where two types of insulation films having different thicknesses are dry-etched simultaneously, and realizes the end point detection at the time when the semiconductor substrate under the thicker insulation film is exposed.

What is claimed is:

1. A method of manufacturing a semiconductor device, comprising:

forming an element isolation film on a semiconductor substrate so as to surround a first region and a second region of the semiconductor substrate;

forming a first gate insulation film on the semiconductor substrate in the first region;

forming a second gate insulation film on the semiconductor substrate in the second region, the second gate insulation film being thicker than the first gate insulation film;

forming a first gate layer on the first gate insulation film;

forming a second gate layer on the second gate insulation film;

forming on the element isolation film a dummy layer for detecting an end point of dry-etching so that the dummy layer is physically in contact with the element isolation film;

forming an insulation layer so as to cover the first gate layer, the second gate layer, the dummy layer, and the semiconductor substrate; and dry-etching the insulation layer, the first gate insulation film and the second gate insulation film so as to form sidewalls covering side surfaces of the first gate layer and the second gate layer and expose the semiconductor substrate in the first region and the second region, wherein the dummy layer is not electrically connected to any gate layers of the semiconductor device, and the first region is electrically isolated from the second region by the element isolation film.

2. The method of claim 1, further comprising patterning the first gate insulation film and the second gate insulation film using the first gate layer, the second gate layer and the sidewalls as a mask during the dry-etching so as to expose the semiconductor substrate.

3. The method of claim 1, further comprising detecting the end point of the dry-etching by detecting a change in an emission intensity of a specific emission spectral line of plasma occurring during the dry-etching.

4. The method of claim 1, wherein the first gate layer, the second gate layer and the dummy layer are formed by patterning a same conductive layer formed on the semiconductor substrate.

5. The method of claim 1, further comprising forming a first transistor comprising the first gate insulation film and the first gate layer and forming a second transistor comprising the second gate insulation film and the second gate layer.

6. The method of claim 1, wherein the second gate insulation film is formed so as not to extend over the first gate insulation film in a sectional view of the semiconductor device.

* * * * *